(12) United States Patent
Saito

(10) Patent No.: US 12,254,146 B2
(45) Date of Patent: Mar. 18, 2025

(54) FLEXIBLE IMAGE DISPLAY DEVICE WITH MOVABLE DETECTOR

(71) Applicant: Yoshito Saito, Kanagawa (JP)

(72) Inventor: Yoshito Saito, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 17/948,247

(22) Filed: Sep. 20, 2022

(65) Prior Publication Data

US 2023/0114712 A1  Apr. 13, 2023

(30) Foreign Application Priority Data

Sep. 30, 2021 (JP) .................. 2021-161334
Aug. 4, 2022 (JP) .................. 2022-125001

(51) Int. Cl.
*G06F 3/041* (2006.01)
*H05K 5/03* (2006.01)

(52) U.S. Cl.
CPC .. *G06F 3/0412* (2013.01); *G06F 2203/04102* (2013.01); *H05K 5/03* (2013.01)

(58) Field of Classification Search
CPC ................. G06F 3/0412; G06F 1/1652; G06F 2203/04102; H05K 5/03
See application file for complete search history.

(56) References Cited

U.S. PATENT DOCUMENTS

| 9,933,820 B2 | 4/2018 | Jacques et al. |
| 2006/0208962 A1 | 9/2006 | Sekiya |
| 2013/0010405 A1 | 1/2013 | Rothkopf et al. |
| 2017/0083047 A1* | 3/2017 | Hélot ................. H10K 59/40 |
| 2021/0191468 A1 | 6/2021 | Nakamura et al. |

FOREIGN PATENT DOCUMENTS

| JP | 2006-253163 | 9/2006 |
| JP | 2015-226204 | 12/2015 |
| WO | WO2020/044171 A1 | 3/2020 |
| WO | 2020/262965 A1 | 12/2020 |

OTHER PUBLICATIONS

Extended European Search Report issued Feb. 20, 2023 in European Patent Application No. 22197129.4, 10 1 pages.

* cited by examiner

*Primary Examiner* — Yaron Cohen
(74) *Attorney, Agent, or Firm* — XSENSUS LLP

(57) ABSTRACT

An image display device includes a flexible display, a touch sensor provided to overlap a back surface of the flexible display, and a housing surrounding the flexible display and the touch sensor. The housing is folded together with the flexible display and the touch sensor at a bent position. The touch sensor includes a first detector and a second detector with the bent position as a boundary. The first detector is bonded to the back surface of the flexible display by an adhesive layer. The second detector is provided without having the adhesive layer between the second detector and the back surface of the flexible display.

6 Claims, 7 Drawing Sheets

FLEXIBLE IMAGE DISPLAY DEVICE WITH MOVABLE DETECTOR

CROSS-REFERENCE TO RELATED APPLICATIONS

This patent application is based on and claims priority pursuant to 35 U.S.C. § 119 (a) to Japanese Patent Application Nos. 2021-161334, filed on Sep. 30, 2021, and 2022-125001, filed on Aug. 4, 2022, in the Japan Patent Office, the entire disclosures of which are hereby incorporated by reference.

BACKGROUND

Technical Field

Embodiments of the present disclosure relate to an image display device.

Related Art

A configuration in which a flexible display is partly bonded to a cover integrally formed with a touch panel to prevent the flexible display from being damaged is known.

SUMMARY

An embodiment of the present disclosure includes an image display device including a flexible display, a touch sensor provided to overlap a back surface of the flexible display, and a housing surrounding the flexible display and the touch sensor. The housing is folded together with the flexible display and the touch sensor at a bent position. The touch sensor includes a first detector and a second detector with the bent position as a boundary. The first detector is bonded to the back surface of the flexible display by an adhesive layer. The second detector is provided without having the adhesive layer between the second detector and the back surface of the flexible display.

An embodiment of the present disclosure includes an image display device including a flexible display, a touch sensor provided to overlap a back surface of the flexible display, and a housing surrounding the flexible display and the touch sensor. The housing is folded together with the flexible display and the touch sensor at a bent position. The touch sensor includes a first detector and a second detector with the bent position as a boundary. Each of the first detector and the second detector is provided without being bonded to the back surface of the flexible display.

BRIEF DESCRIPTION OF THE DRAWINGS

A more complete appreciation of embodiments of the present disclosure and many of the attendant advantages and features thereof can be readily obtained and understood from the following detailed description with reference to the accompanying drawings, wherein.

Figure 1A:
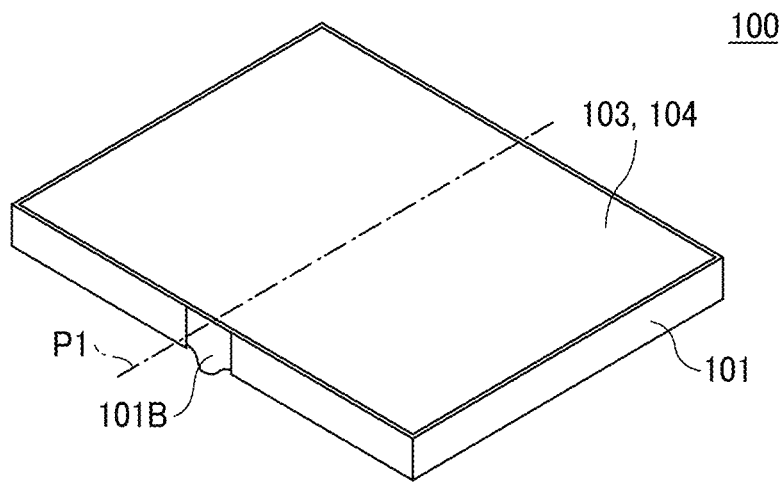
FIGS. 1A to 1C are external perspective views of an image display device according to a first embodiment of the disclosure.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an," and "the" are intended to include the plural forms as well, unless the context clearly indicates otherwise.

Embodiments of the present disclosure are described with reference to the attached drawings.

With respect to a touch sensor, a flexible display, and a cover, when a user uses an image display device, a surface facing the user is referred to as a "front surface," and a surface on a opposite side to the user is referred to as a "back surface."

First Embodiment

Figure 1B:
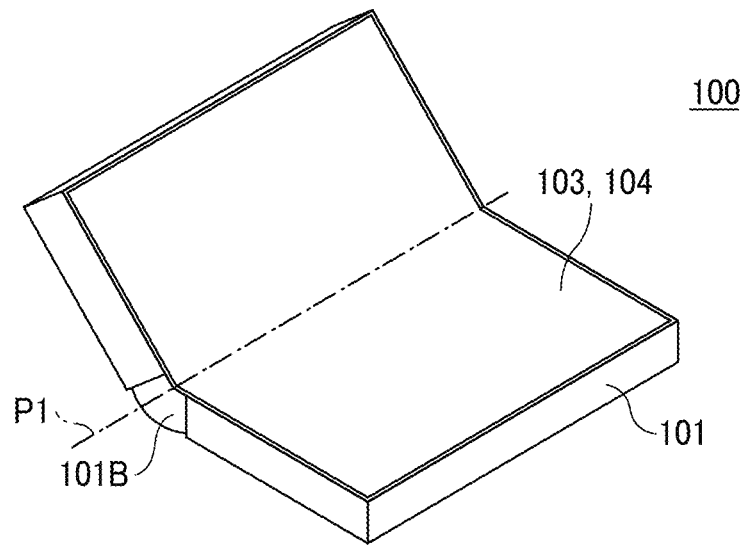
Figure 1C:
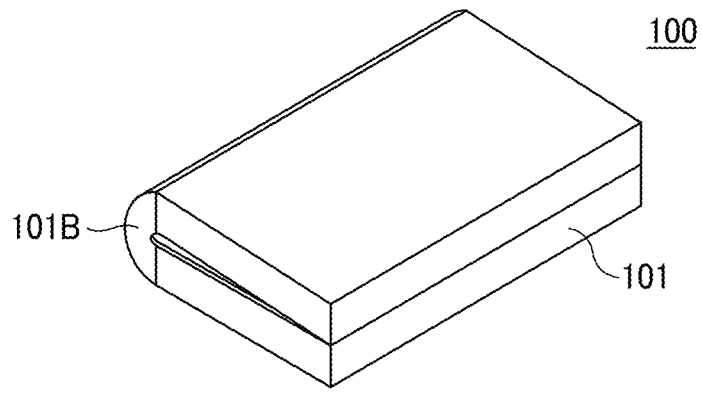

Overview of Image Display Device 100:

FIGS. 1A to 1C are external perspective views of an image display device 100 according to a first embodiment. An image display device 100 illustrated in FIG. 1 is a folding terminal device. A flexible display 103 and a touch sensor 104 are provided in an overlapping manner on a front surface of a housing 101 of the image display device 100. In an unfolded state illustrated in FIG. 1A, the image display device 100 displays an image by the flexible display 103 and detects a touch operation by the touch sensor 104. The image display device 100 is folded into two as illustrated in FIG. 1C by being valley folded by a bent portion 101B at a bent position P1 (intermediate position) as illustrated in FIG. 1B, from the unfolded state illustrated in FIG. 1A. This allows the image display device 100 to be carried and stored compactly. An example of the image display device 100 include a smartphone, a tablet terminal, a game machine, and a personal digital assistant (PDA).

Figure 2:
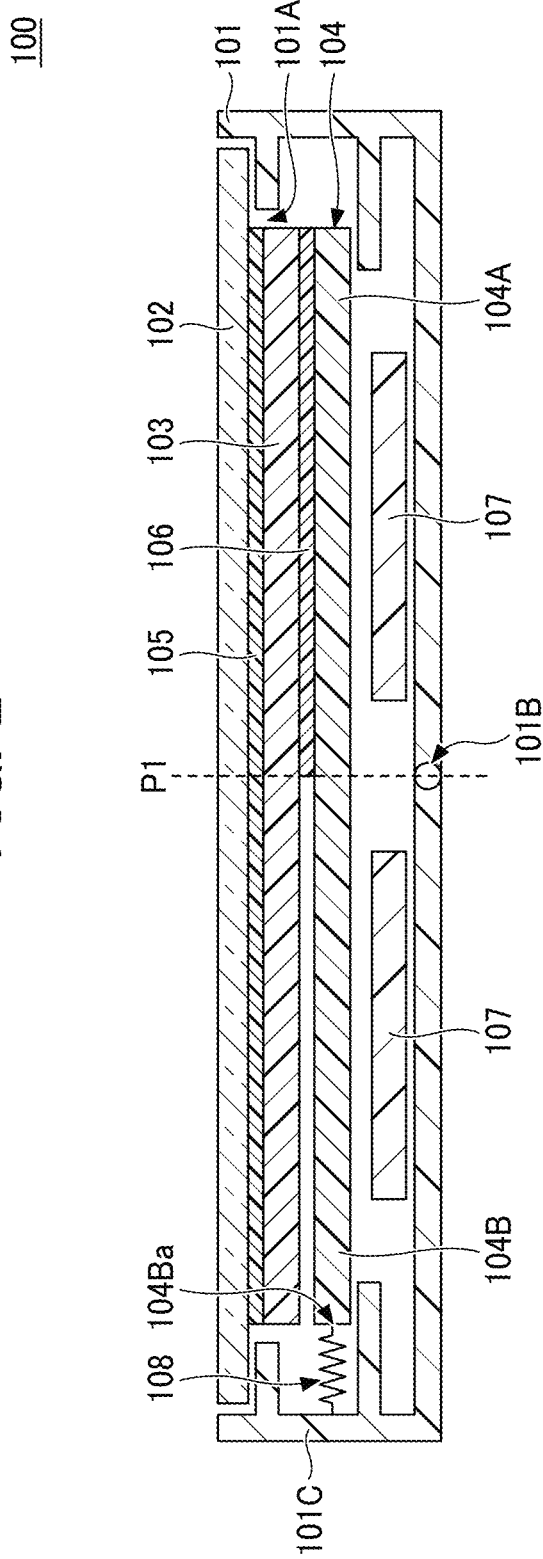
FIG. 2 is a cross-sectional view illustrating a configuration of the image display device according to the first embodiment of the present disclosure.

Configuration of Image Display Device 100:

FIG. 2 is a cross-sectional view illustrating a configuration of the image display device 100 according to the first embodiment. As illustrated in FIG. 2, the image display device 100 includes the housing 101, a cover 102, the flexible display 103, the touch sensor 104, an adhesive layer 105, an adhesive layer 106, a substrate 107, and a first elastic member 108.

The housing 101 is a thin box-shaped member. Components (the flexible display 103, the touch sensor 104, the substrate 107, and the first elastic member 108) of the image display device 100 are accommodated in the housing 101. An opening 101A is formed in the front surface of the housing 101. The housing 101 has the bent position P1 (for example, a hinge) in the bent portion 101B, and can be folded into two by being valley folded by the bent portion 101B.

In the housing 101, for example, the bent portion 101B is made of a stretchable material in order to bend the housing 101, and the other portions can be made of a material having high rigidity in order to protect the internal structure of the housing 101. In addition, in the housing 101, the bent portion 101B may be made of a plurality of members (for example, shaft and bearing) so that the bent portion 101B can be bent.

The housing 101 surrounds at least a part of the flexible display 103 and the touch sensor 104 so that the housing 101 can be bent together with the flexible display 103 and the touch sensor 104. For example, the housing 101 is arranged to surround a part of the flexible display 103 and the touch sensor 104 arranged inside the opening 101A provided in the front surface, with a portion around the opening 101A. In this manner, the housing 101 may surround the flexible display 103 and the touch sensor 104 to such an extent that the housing 101 can be bent together with the flexible display 103 and the touch sensor 104.

The cover 102 is a flexible transparent sheet-like member that closes the opening 101A of the housing 101. The cover 102 is bonded to a front surface of the flexible display 103 by the adhesive layer 105 (for example, a double-sided tape or an adhesive) provided between the cover 102 and the flexible display 103 so as to close the opening 101A of the housing 101.

Accordingly, the cover 102 may protect the front surface of the flexible display 103. For example, the cover 102 is formed by using a thin sheet-like material such as resin or glass.

The flexible display 103 is a sheet-like display having flexibility.

The flexible display 103 is provided on the opening 101A formed in a front surface portion of the housing 101. The flexible display 103 displays various kinds of information. For example, an organic electroluminescence (EL) display or a liquid crystal display is used as the flexible display 103.

The touch sensor 104 is a sheet-like sensor having flexibility and provided so as to overlap with a back surface of the flexible display 103. The touch sensor 104 detects a touch operation performed by a user on the flexible display 103. As the touch sensor 104, a touch sensor (for example, an electromagnetic induction type touch sensor) that detects a touch operation performed by a user from the back surface of the flexible display 103 is used. The touch sensor 104 includes a first detector 104A on one side with respect to the bent position P1 and a second detector 104B on the other side with respect to the bent position P1. The first detector 104A is bonded to the back surface of the flexible display 103 by the adhesive layer 106 (for example, a double-sided tape or an adhesive) provided between the first detector 104A and the flexible display 103. On the other hand, the second detector 104B is not bonded to the back surface of the flexible display 103. It is preferable that the entire surface of the first detector 104A is bonded to the back surface of the flexible display 103, but the present disclosure is not limited thereto, and a part of the surface of the first detector 104A may be bonded to the back surface of the flexible display 103.

The substrate 107 is formed of a hard flat plate member. The substrate 107 is disposed on the bottom surface inside the housing 101. Various electronic components are mounted on the substrate 107 to constitute an electronic circuit that controls operations of the image display device 100 (for example, displaying by the flexible display 103, detecting by the touch sensor 104, and performing wireless communications).

The first elastic member 108 is provided between an end 104Ba of the second detector 104B of the touch sensor 104 and a wall 101C of the housing 101. One end of the first elastic member 108 is fixed to the end 104Ba of the second detector 104B of the touch sensor 104, and the other end of the first elastic member 108 is fixed to the wall 101C of the housing 101. The wall 101C is a surface of the housing 101 surrounding the touch sensor 104 and faces the touch sensor 104 as illustrated in FIG. 2, but the wall 101C is not limited to this. The first elastic member 108 pulls the end 104Ba of the second detector 104B of the touch sensor 104 toward the wall 101C of the housing 101. Accordingly, the first elastic member 108 applies tension to the second detector 104B so that the second detector 104B that is not bonded to the flexible display 103 is not loosened. For example, a coil spring is used as the first elastic member 108.

Figure 3A:
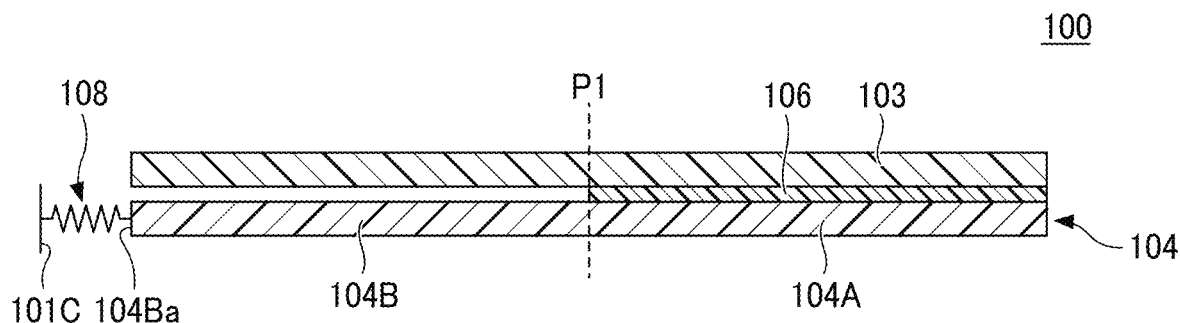
FIGS. 3A and 3B are diagrams illustrating a folding movement of the image display device according to the first embodiment of the disclosure.
Figure 3B:
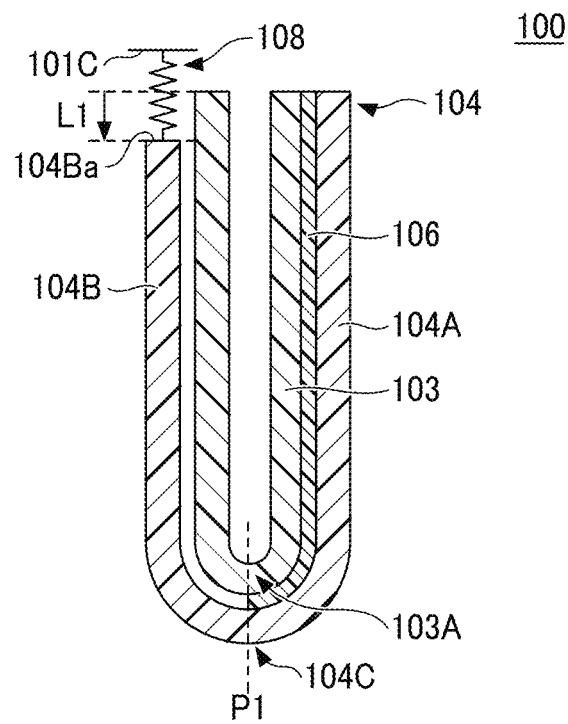

Folding Movement of Image Display Device 100:

FIGS. 3A and 3B are diagrams illustrating a folding movement of the image display device 100 according to the first embodiment. Referring to FIGS. 3A and 3B, the folding movement of the image display device 100 is described using a part (the flexible display 103, the touch sensor 104, and the first elastic member 108) of the image display device 100.

As illustrated in FIGS. 3A and 3B, the image display device 100 according to the first embodiment can be folded into two by being valley folded at the bent position P1 with the flexible display 103 inside and the touch sensor 104 outside.

As illustrated in FIG. 3B, at the bent position P1, a radius of curvature of a bent portion 104C of the touch sensor 104 is greater than a radius of curvature of a bent portion 103A of the flexible display 103. Due to this, if the entire touch sensor 104 is bonded to the flexible display 103, a stretching load is applied to the bent portion 104C of the touch sensor 104, and damage such as cracking may occur in the bent portion 104C of the touch sensor 104.

To cope with this, the image display device 100 according to the first embodiment uses the configuration in which the first detector 104A and the second detector 104B are provided in the touch sensor 104 with the bent position P1 as a boundary, the first detector 104A is bonded to the back surface of the flexible display 103 by the adhesive layer 105, and the second detector 104B is not bonded to the back surface of the flexible display 103.

With this configuration, when the image display device 100 according to the first embodiment is folded into two as illustrated in FIG. 3B, the second detector 104B of the touch sensor 104 relatively moves toward the bent position P1 with respect to the flexible display 103 according to the above-described difference of the radius of curvature. With this configuration, the image display device 100 according to the first embodiment can absorb the load applied to the bent portion 104C of the touch sensor 104. Accordingly, the image display device 100 according to the first embodiment can prevent the bent portion 104C of the touch sensor 104 from being damaged.

In the image display device 100 according to the first embodiment, since the first detector 104A is fixed, the second detector 104B alone moves. For this reason, in the image display device 100 according to the first embodiment, although misalignment of the second detector 104B with respect to the flexible display 103 occurs, misalignment of the first detector 104A with respect to the flexible display 103 does not occur. Accordingly, the image display device 100 according to the first embodiment is more suitable for a use form in which the first detector 104A is mainly used in the folded state.

In addition, in the image display device 100 according to the first embodiment, the end 104Ba of the second detector 104B of the touch sensor 104 is pulled toward the wall 101C of the housing 101 by the first elastic member 108 in both of the unfolded state illustrated in FIG. 3A and the folded state illustrated in FIG. 3B. Accordingly, the image display device 100 according to the first embodiment can apply tension to the second detector 104B so that the second detector 104B that is not bonded to the flexible display 103 is not loosened.

Second Embodiment

Figure 4:
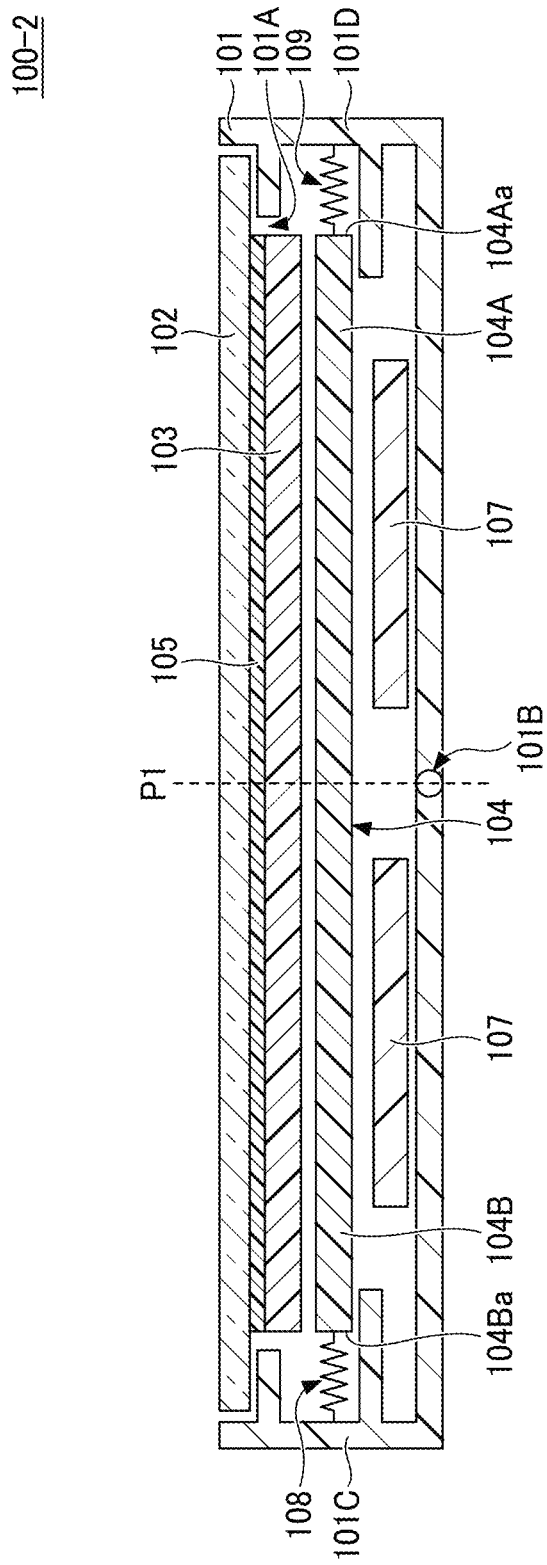
FIG. 4 is a cross-sectional view illustrating a configuration of an image display device according to a second embodiment of the disclosure.

Configuration of Image Display Device 100-2:

FIG. 4 is a cross-sectional view illustrating a configuration of an image display device 100-2 according to a second embodiment. The image display device 100-2 according to the second embodiment is described below. In particular, differences from the image display device 100 according to the first embodiment are described below. The image display device 100-2 according to the second embodiment is similar to the image display device 100 according to the first embodiment in that the end 104Ba of the second detector 104B of the touch sensor 104 is pulled toward the wall 101C of the housing 101 by the first elastic member 108.

As illustrated in FIG. 4, the image display device 100-2 according to the second embodiment is different from the image display device 100 according to the first embodiment in that each of the first detector 104A and the second detector 104B of the touch sensor 104 is not bonded to the back surface of the flexible display 103 (namely, does not include the adhesive layer 106) and in that a second elastic member 109 is further included.

The second elastic member 109 is provided between an end 104Aa of the first detector 104A of the touch sensor 104 and a wall 101D of the housing 101. One end of the second elastic member 109 is fixed to the end 104Aa of the first detector 104A of the touch sensor 104, and the other end of the second elastic member 109 is fixed to the wall 101D of the housing 101. The second elastic member 109 pulls the end 104Aa of the first detector 104A of the touch sensor 104 toward the wall 101D of the housing 101. Accordingly, the second elastic member 109 applies tension to the first detector 104A so that the first detector 104A that is not bonded to the flexible display 103 is not loosened.

For example, a coil spring is used as the second elastic member 109.

Figure 5:
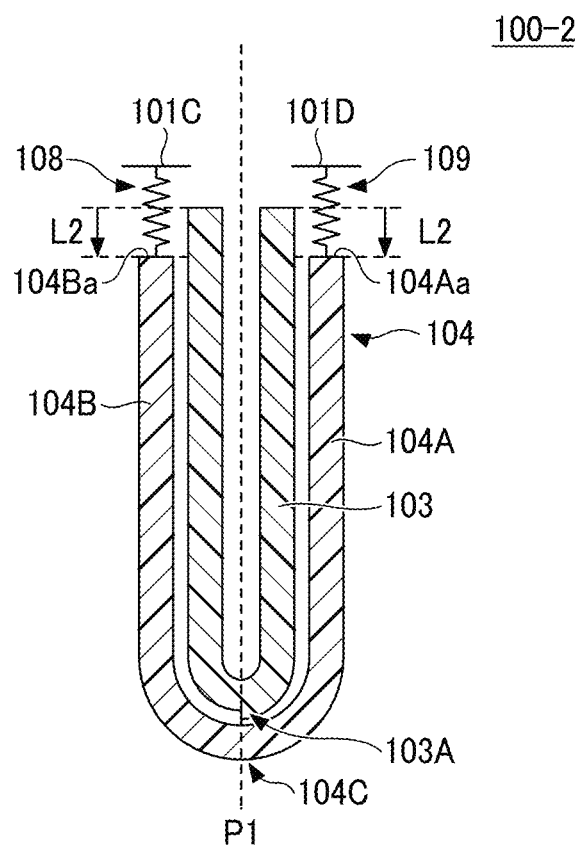
FIG. 5 is a diagram illustrating a folding movement of the image display device according to the second embodiment of the disclosure.

Folding Movement of Image Display Device 100-2:

FIG. 5 is a diagram illustrating a folding movement of the image display device 100-2 according to the second embodiment. In FIG. 5, the folding movement of the image display device 100-2 is described using a part (the flexible display 103, the touch sensor 104, the first elastic member 108, and the second elastic member 109) of the image display device 100-2.

The image display device 100-2 according to the second embodiment uses the configuration in which the first detector 104A and the second detector 104B are provided in the touch sensor 104 with the bent position P1 as a boundary, and neither the first detector 104A nor the second detector 104B is bonded to the back surface of the flexible display 103.

With this configuration, when the image display device 100-2 according to the second embodiment is folded into two as illustrated in FIG. 5, each of the first detector 104A the second detector 104B of the touch sensor 104 relatively moves toward the bent position P1 with respect to the flexible display 103 according to the above-described difference of the radius of curvature. With this configuration, the image display device 100-2 according to the second embodiment can absorb the load applied to the bent portion 104C of the touch sensor 104. Accordingly, the image display device 100-2 according to the second embodiment can prevent the bent portion 104C of the touch sensor 104 from being damaged.

In addition, in the image display device 100-2 according to the second embodiment, a movement amount L2 of each of the first detector 104A and the second detector 104B is half of a movement amount L1 of the second detector 104B in the image display device 100 according to the first embodiment. Accordingly, in the image display device 100-2 according to the second embodiment, although misalignment of each of the first detector 104A and the second detector 104B with respect to the flexible display 103 occurs, an amount of misalignment of the first detector 104A and the second detector 104B with respect to the flexible display 103 can be reduced more than the amount of misalignment of the second detector 104B in the image display device 100 according to the first embodiment. Accordingly, the image display device 100-2 according to the second embodiment is more suitable for a use form in which both of the first detector 104A and the second detector 104B are used in the folded state.

In addition, in the image display device 100-2 according to the second embodiment, the end 104Ba of the second detector 104B of the touch sensor 104 is pulled toward the wall 101C of the housing 101 by the first elastic member 108 in both of the unfolded state and the folded state illustrated in FIG. 5.

In addition, in the image display device 100-2 according to the second embodiment, the end 104Aa of the first detector 104A of the touch sensor 104 is pulled toward the wall 101D of the housing 101 by the second elastic member 109 in both of the unfolded state and the folded state illustrated in FIG. 5.

Accordingly, the image display device 100-2 according to the second embodiment can apply tension to the first detector 104A and the second detector 104B so that the first detector 104A and the second detector 104B which are not bonded to the flexible display 103 are not loosened.

Third Embodiment

Figure 6:
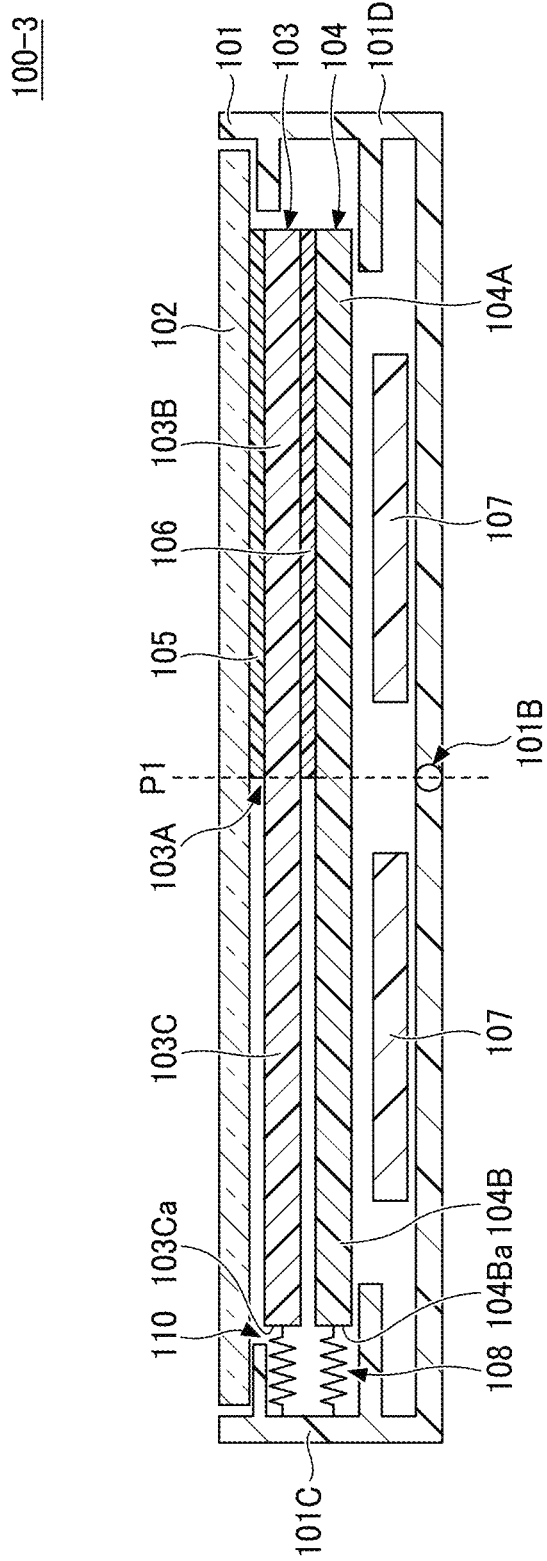
FIG. 6 is a cross-sectional view illustrating a configuration of an image display device according to a third embodiment of the disclosure.

Configuration of Image Display Device 100-3:

FIG. 6 is a cross-sectional view illustrating a configuration of an image display device 100-3 according to a third embodiment. The image display device 100-3 according to the third embodiment is described below. In particular, differences from the image display device 100 according to the first embodiment are described below. The image display device 100-3 according to the third embodiment is similar to the image display device 100 according to the first embodiment in that the end 104Ba of the second detector 104B of the touch sensor 104 is pulled toward the wall 101C of the housing 101 by the first elastic member 108.

In the image display device 100-3 according to the third embodiment, the flexible display 103 includes a first display 103B on one side with respect to the bending position P1 (bent portion 103A) and a second display 103C on the other side with respect to the bent position P1 (bent portion 103A). The first display 103B is bonded to a back surface of the cover 102 by the adhesive layer 105 (for example, a double-sided tape or an adhesive) provided between the first display 103B and the cover 102. On the other hand, the second display 103C is not bonded to the back surface of the cover 102.

The image display device 100-3 according to the third embodiment further includes a third elastic member 110. The third elastic member 110 is provided between an end 103Ca of the second display 103C of the flexible display 103 and the wall 101C of the housing 101. One end of the third elastic member 110 is fixed to the end 103Ca of the second display 103C of the flexible display 103, and the other end of the third elastic member 110 is fixed to the wall 101C of the housing 101. The third elastic member 110 pulls the end 103Ca of the second display 103C of the flexible display 103 toward the wall 101C of the housing 101. Accordingly, the third elastic member 110 applies tension to the second display 103C so that the second display 103C that is not bonded to the cover 102 is not loosened. For example, a coil spring is used as the third elastic member 110.

In the image display device 100-3 according to the third embodiment, the second display 103C of the flexible display 103 relatively moves toward the bent position P1 with respect to the cover 102 according to difference in radius of curvature between the cover 102 and the flexible display 103 when the image display device 100-3 is folded into two. With this configuration, the image display device 100-3 according to the third embodiment can absorb the load applied to the bent portion 103A of the flexible display 103. Accordingly, the image display device 100-3 according to the third embodiment can prevent the bent portion 103A of the flexible display 103 from being damaged.

In addition, in the image display device 100-3 according to the third embodiment, the end 103Ca of the second display 103C of the flexible display 103 is pulled toward the wall 101C of the housing 101 by the third elastic member 110 in both of the unfolded state and the folded state. Accordingly, the image display device 100-3 according to the third embodiment can apply tension to the second display 103C so that the second display 103C that is not bonded to the cover 102 is not loosened.

Fourth Embodiment

Figure 7:
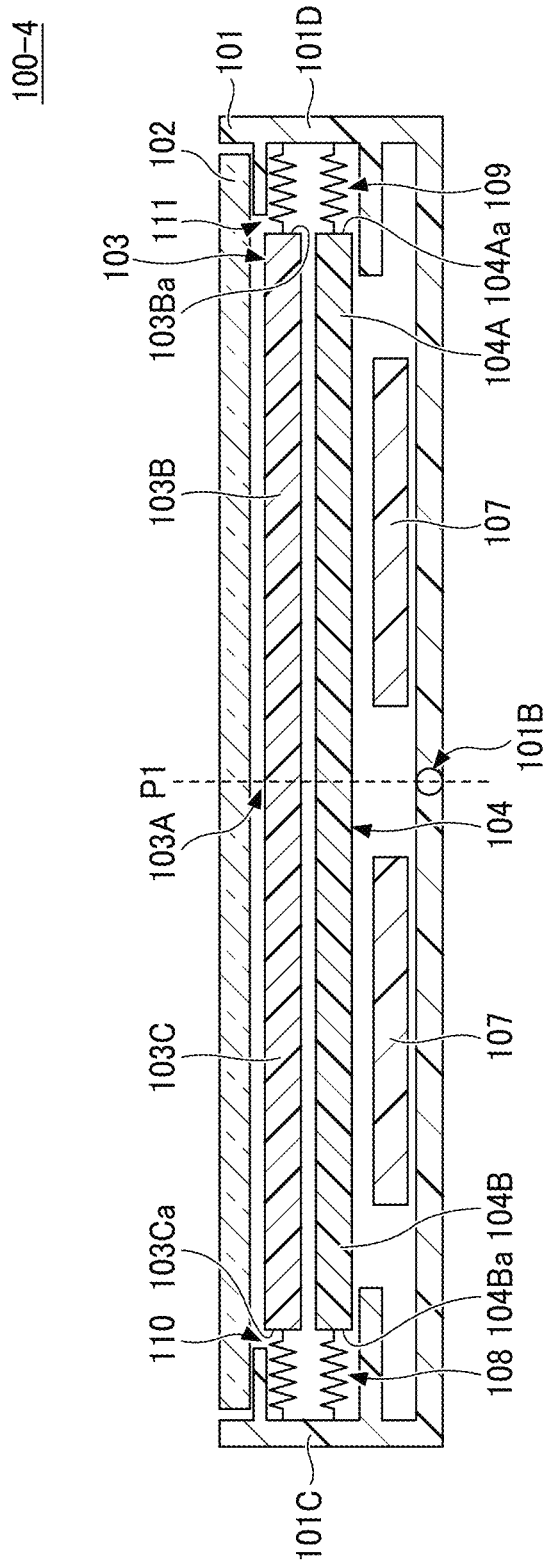
FIG. 7 is a cross-sectional view illustrating a configuration of an image display device according to a fourth embodiment of the disclosure.

Configuration of Image Display Device 100-4:

FIG. 7 is a cross-sectional view illustrating a configuration of an image display device 100-4 according to a fourth embodiment. The image display device 100-4 according to the fourth embodiment is described below. In particular, differences from the image display device 100-2 according to the second embodiment are described below. The image display device 100-4 according to the fourth embodiment is similar to the image display device 100-2 according to the second embodiment in that the end 104Ba of the second detector 104B of the touch sensor 104 is pulled toward the wall 101C of the housing 101 by the first elastic member 108, and the end 104Aa of the first detector 104A of the touch sensor 104 is pulled toward the wall 101D of the housing 101 by the second elastic member 109.

In the image display device 100-4 according to the fourth embodiment, the flexible display 103 includes the first display 103B on one side with respect to the bending position P1 (bent portion 103A) and the second display 103C on the other side with respect to the bent position P1 (bent portion 103A). Neither the first display 103B nor the second display 103C is bonded to the back surface of the cover 102. In other words, the image display device 100-4 does not include the adhesive layer 105.

The image display device 100-4 according to the fourth embodiment further includes the third elastic member 110 and a fourth elastic member 111.

The third elastic member 110 is provided between the end 103Ca of the second display 103C of the flexible display 103 and the wall 101C of the housing 101. One end of the third elastic member 110 is fixed to the end 103Ca of the second display 103C of the flexible display 103, and the other end thereof is fixed to the wall 101C of the housing 101. The third elastic member 110 pulls the end 103Ca of the second display 103C of the flexible display 103 toward the wall 101C of the housing 101. Accordingly, the third elastic member 110 applies tension to the second display 103C so that the second display 103C that is not bonded to the cover 102 is not loosened. For example, a coil spring is used as the third elastic member 110.

The fourth elastic member 111 is provided between an end 103Ba of the first display 103B of the flexible display 103 and the wall 101D of the housing 101. One end of the fourth elastic member 111 is fixed to the end 103Ba of the first display 103B of the flexible display 103, and the other end of the fourth elastic member 111 is fixed to the wall 101D of the housing 101. The fourth elastic member 111 pulls the end 103Ba of the first display 103B of the flexible display 103 toward the wall 101D of the housing 101. Accordingly, the fourth elastic member 111 applies tension to the first display 103B so that the first display 103B that is not bonded to the cover 102 is not loosened. For example, a coil spring is used as the fourth elastic member 111.

In the image display device 100-4 according to the fourth embodiment, each of the first display 103B and the second display 103C of the flexible display 103 relatively moves toward the bent position P1 with respect to the cover 102 according to difference in radius of curvature between the cover 102 and the flexible display 103 when the image display device 100-4 is folded into two. With this configuration, the image display device 100-4 according to the fourth embodiment can absorb the load applied to the bent portion 103A of the flexible display 103. Accordingly, the image display device 100-4 according to the fourth embodiment can prevent the bent portion 103A of the flexible display 103 from being damaged.

In addition, in the image display device 100-4 according to the fourth embodiment, the end 103Ca of the second display 103C of the flexible display 103 is pulled toward the wall 101C of the housing 101 by the third elastic member 110 in both of the unfolded state and the folded state. Accordingly, the image display device 100-4 according to the fourth embodiment can apply tension to the second display 103C so that the second display 103C that is not bonded to the cover 102 is not loosened.

In addition, in the image display device 100-4 according to the fourth embodiment, the end 103Ba of the first display 103B of the flexible display 103 is pulled toward the wall 101D of the housing 101 by the fourth elastic member 111 in both of the unfolded state and the folded state. Accordingly, the image display device 100-4 according to the fourth embodiment can apply tension to the first display 103B so that the first display 103B that is not bonded to the cover 102 is not loosened.

As described above, each of the image display device 100 according to the first embodiment and the image display device 100-3 according to the third embodiment includes the flexible display 103, the touch sensor 104 provided to overlap the back surface of the flexible display 103, and the housing 101 that surrounds the flexible display 103 and the touch sensor 104 and can be folded together with the flexible display 103 and the touch sensor 104 at the bent position P1. The touch sensor 104 includes the first detector 104A and the second detector 104B with the bent position P1 as a boundary. The first detector 104A is bonded to the back surface of the flexible display 103 by the adhesive layer 106, and the second detector 104B is not bonded to the back surface of the flexible display 103.

Accordingly, in each of the image display device 100 according to the first embodiment and the image display device 100-3 according to the third embodiment, the second detector 104B of the touch sensor 104 moves toward the bent position P1, and this can reduce the load applied to the bent portion 104C of the touch sensor 104. Accordingly, according to each of the image display device 100 according to the first embodiment and the image display device 100-3 according to the third embodiment, the bent portion 104C of the touch sensor 104 disposed on the back surface of the flexible display 103 is prevented from being damaged.

Further, each of the image display device 100 according to the first embodiment and the image display device 100-3 according to the third embodiment includes the first elastic member 108 that pulls the end 104Ba of the second detector 104B of the touch sensor 104 toward the wall 101C of the housing 101.

Accordingly, each of the image display device 100 according to the first embodiment and the image display device 100-3 according to the third embodiment can prevent the second detector 104B of the touch sensor 104 from being loosen.

The image display device 100-3 according to the third embodiment further includes the cover 102 provided to overlap the front surface of the flexible display 103. The flexible display 103 has the first display 103B and the second display 103C with the bent position P1 as a boundary, the first display 103B is bonded to the back surface of the cover 102 by the adhesive layer 105, and the second display 103C is not bonded to the back surface of the cover 102.

Accordingly, in the image display device 100-3 according to the third embodiment, the second display 103C of the flexible display 103 moves toward the bent position P1, and this reduces the load applied to the bent portion 103A of the flexible display 103. Accordingly, according to the image display device 100-3 according to the third embodiment, the bent portion 103A of the flexible display 103 is prevented from being damaged.

Further, the image display device 100-3 according to the third embodiment includes the third elastic member 110 that pulls the end 103Ca of the second display 103C of the flexible display 103 toward the wall 101C of the housing 101.

Accordingly, the image display device 100-3 according to the third embodiment can prevent the second display 103C of the flexible display 103 from being loosen.

In addition, as described above, each of the image display device 100-2 according to the second embodiment and the image display device 100-4 according to the fourth embodiment includes the flexible display 103, the touch sensor 104 provided to overlap the back surface of the flexible display 103, and the housing 101 that surrounds the flexible display 103 and the touch sensor 104 and can be folded together with the flexible display 103 and the touch sensor 104 at the bent position P1. The touch sensor 104 includes the first detector 104A and the second detector 104B with the bent position P1 as a boundary. Each of the first detector 104A and the second detector 104B is not bonded to the back surface of the flexible display 103.

Accordingly, in the image display device 100-2 according to the second embodiment and the image display device 100-4 according to the fourth embodiment, each of the first detector 104A and the second detector 104B of the touch sensor 104 moves toward the bent position P1, and this can reduce the load applied to the bent portion 104C of the touch sensor 104. Accordingly, according to each of the image display device 100-2 according to the second embodiment and the image display device 100-4 according to the fourth embodiment, the bent portion 104C of the touch sensor 104 disposed on the back surface of the flexible display 103 is prevented from being damaged.

In addition, each of the image display device 100-2 according to the second embodiment and the image display device 100-4 according to the fourth embodiment includes the first elastic member 108 that pulls the end 104Ba of the second detector 104B of the touch sensor 104 toward the wall 101C of the housing 101, and the second elastic member 109 that pulls the end 104Aa of the first detector 104A of the touch sensor 104 toward the wall 101D of the housing 101.

Accordingly, each of the image display device 100-2 according to the second embodiment and the image display device 100-4 according to the fourth embodiment can prevent each of the first detector 104A and the second detector 104B of the touch sensor 104 from being loosen.

The image display device 100-4 according to the fourth embodiment further includes the cover 102 provided so as to overlap the front surface of the flexible display 103. The flexible display 103 includes the first display 103B and the second display 103C with the bent position P1 as a boundary, and each of the first display 103B and the second display 103C is not bonded to the back surface of the cover 102.

Accordingly, in the image display device 100-4 according to the fourth embodiment, each of the first display 103B and the second display 103C of the flexible display 103 moves toward the bent position P1, and this reduces the load applied to the bent portion 103A of the flexible display 103. Accordingly, according to the image display device 100-4 according to the fourth embodiment, the bent portion 103A of the flexible display 103 is prevented from being damaged.

Further, the image display device 100-4 according to the fourth embodiment includes the third elastic member 110 that pulls the end 103Ca of the second display 103C of the flexible display 103 toward the wall 101C of the housing 101, and the fourth elastic member 111 that pulls the end 103Ba of the first display 103B of the flexible display 103 toward the wall 101D of the housing 101.

Accordingly, the image display device 100-4 according to the fourth embodiment can prevent each the first display 103B and the second display 103C of the flexible display 103 from being loosen.

The above-described embodiments are illustrative and do not limit the present disclosure. Thus, numerous additional modifications and variations are possible in light of the above teachings. For example, elements and/or features of different illustrative embodiments may be combined with each other and/or substituted for each other within the scope of the present disclosure.

For example, the cover 102 may detect a touch operation performed on the flexible display 103 by being integrated with an electrostatic sensor, for example.

Aspects of the present disclosure are, for example, as follows.

Aspect 1:

According to a first aspect of the present disclosure, an image display device includes a flexible display, a touch sensor provided to overlap a back surface of the flexible display, and a housing that surrounds the flexible display and the touch sensor and that can be folded together with the flexible display and the touch sensor at a folding position.

The touch sensor includes a first detector and a second detector with the bending position as a boundary.

The first detector is bonded to the back surface of the flexible display by an adhesive layer.

The second detector is not bonded to the back surface of the flexible display.

Second Aspect:

According to a second aspect of the present disclosure, the image display device according to the above-described first aspect further includes a first elastic member that pulls an end of the second detector of the touch sensor toward a wall of the housing.

Third Aspect:

According to a third aspect of the present disclosure, the image display device according to any one of the above-described first aspect and the above-described second aspect further includes a cover provided to overlap a front surface of the flexible display.

The flexible display includes a first display and a second display with the bent position as a boundary.

The first display is bonded to the back surface of the cover by an adhesive layer The second display is not bonded to the back surface of the cover.

Fourth Aspect:

According to a fourth aspect of the present disclosure, the image display device according to the above-described third aspect further includes a third elastic member that pulls an end of the second display of the flexible display toward a wall of the housing.

Fifth Aspect:

According to a fifth aspect of the present disclosure, in the image display device according to any one of the above-described third aspect and the above-described fourth aspect, the cover detects a touch operation performed on the flexible display.

Sixth Aspect:

According to a sixth aspect, an image display device includes a flexible display, a touch sensor provided to overlap a back surface of the flexible display, and a housing that surrounds the flexible display and the touch sensor and can be folded together with the flexible display and the touch sensor at a folding position.

The touch sensor includes a first detector and a second detector with the bending position as a boundary.

Each of the first detector and the second detector are not bonded to the back surface of the flexible display.

Seventh Aspect:

According to a seventh aspect of the present disclosure, the image display device according to the above-described sixth aspect further includes a first elastic member that pulls an end of the second detector of the touch sensor toward a wall of the housing, and a second elastic member that pulls an end portion of the first detector of the touch sensor toward a wall of the housing.

Eighth Aspect:

According to an eighth aspect of the present disclosure, the image display device according to any one of the above-described sixth aspect and the above-described seventh aspect further includes a cover provided to overlap a front surface of the flexible display.

The flexible display includes a first display and a second display with the bent position as a boundary.

Each of the first display and the second display is not bonded to the back surface of the cover.

Ninth Aspect:

According to a ninth aspect of the present disclosure, the image display device according to the above-described eighth aspect further includes a third elastic member that pulls an end of the second display of the flexible display toward a wall of the housing, and a fourth elastic member that pulls an end of the first display of the flexible display toward a wall of the housing.

Tenth Aspect:

According to a tenth aspect of the present disclosure, in the image display device according to any one of the above-described eighth aspect and the above-described ninth aspect, the cover detects a touch operation performed on the flexible display.

With respect to a related art, a known configuration in which a flexible display is partly bonded to a cover integrally formed with a touch panel is applicable to a configuration in which a touch sensor is disposed on a front surface of a flexible display such as a capacitive type, but is not applicable to a configuration in which a touch sensor is disposed on a back surface of a flexible display such as an electromagnetic induction type.

According to an embodiment of the present disclosure, an image display device that prevents a bent portion of a touch sensor disposed on a back surface of a flexible display from being damaged is provided.

The invention claimed is:

1. An image display device, comprising:
    a flexible display;
    a touch sensor provided to overlap a back surface of the flexible display; and
    a housing surrounding the flexible display and the touch sensor, and configured to be folded together with the flexible display and the touch sensor at a bent position,
    wherein
        the touch sensor includes a first detector and a second detector with the bent position as a boundary,
        the first detector is bonded to the back surface of the flexible display by an adhesive layer,
        the second detector is provided without having the adhesive layer between the second detector and the back surface of the flexible display,
        the first detector and the second detector form one continuous sheet,
        the housing is configured to be folded in half by being folded at a bent portion into a valley fold with the flexible display on an inside and the touch sensor on an outside, and
        an entire surface of the touch sensor on one side with respect to the bent portion is bonded to the back surface of the flexible display, and the second detector on the other side with respect to the bent portion is not bonded to the back surface of the flexible display.

2. The image display device of claim 1, further comprising
an elastic member having a first end connected to a wall of the housing and a second end connected to an end of the second detector to apply tension to the second detector so that the second detector that is not bonded to the flexible display is not loosened.

3. The image display device of claim 1, further comprising
a cover provided to overlap a front surface of the flexible display,
wherein
the flexible display includes a first display and a second display with the bent position as a boundary,
the first display is bonded to a back surface of the cover by another adhesive layer, and
the second display is provided without having the another adhesive layer between the second display and the back surface of the cover.

4. The image display device of claim 3, further comprising
an elastic member having a first end connected to a wall of the housing and a second end connected to an end of the second detector to apply tension to the second detector so that the second detector that is not bonded to the flexible display is not loosened.

5. The image display device of claim 3, wherein
the cover is configured to detect a touch operation performed on the flexible display.

6. The image display device of claim 1, wherein the second detector moves toward the bent position relative to the flexible display according to a difference in radius of curvature between the flexible display and the touch sensor, when the housing is folded into two at the bent position.

* * * * *